(12) United States Patent
Ogiwara et al.

(10) Patent No.: US 7,061,788 B2
(45) Date of Patent: Jun. 13, 2006

(54) SEMICONDUCTOR STORAGE DEVICE

(75) Inventors: Ryu Ogiwara, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 11/037,109

(22) Filed: Jan. 19, 2005

(65) Prior Publication Data

US 2006/0067100 A1 Mar. 30, 2006

(30) Foreign Application Priority Data

Sep. 28, 2004 (JP) ............................. 2004-282031

(51) Int. Cl.
*G11C 11/22* (2006.01)
(52) U.S. Cl. ...................... 365/145; 365/149; 365/203
(58) Field of Classification Search ................ 365/145, 365/149, 203
See application file for complete search history.

(56) References Cited

U.S. PATENT DOCUMENTS

| | | | | |
|---|---|---|---|---|
| 6,026,009 A * | 2/2000 | Choi et al. | ................... | 365/145 |
| 6,392,916 B1 * | 5/2002 | Choi et al. | ................... | 365/145 |
| 6,510,071 B1 * | 1/2003 | Oowaki | ....................... | 365/145 |

FOREIGN PATENT DOCUMENTS

| JP | 2000-339973 | 12/2000 |
|---|---|---|
| JP | 2002-216498 | 8/2002 |

OTHER PUBLICATIONS

Ryu Ogiwara, et al. "A 0.5-μm, 3-V, 1T1C, 1-Mbit FRAM with a Variable Reference Bit-Line Voltage Scheme Using a Fatigue-Free Reference Capacitor", IEEE Journal of Solid-State Circuits, vol. 35, No. 4, Apr. 2000, pp. 545-551.

Daisaburo Takashima, et al. "High-Density Chain Ferroelectric Random Access Memory (Chain FRAM)", IEEE Journal of Solid-State Circuits, vol. 33, No. 5, May 1998, pp. 787-792.

(Continued)

*Primary Examiner*—Son T. Dinh
(74) *Attorney, Agent, or Firm*—Oblon, Spivak, McClelland, Maier & Neustadt, P.C.

(57) ABSTRACT

A semiconductor storage device comprises first and second memory cells, each connected to the first pair of word line and bit line and a second pair of word line and bit line, a sense amplifier connected between the first and second bit lines, a first capacitor whose storage electrode being connected to the first bit line, a second capacitor whose storage electrode being connected to the second bit line, first and second wires respectively connected to the first and second plate electrodes of the first and second capacitors, wherein the first and second bit lines are in a complementary relation, and when "0" is read to the first bit line, the first capacitor has an operation to increase a potential of the first plate electrode through the first wire before the sense amplifier operates.

19 Claims, 17 Drawing Sheets

OTHER PUBLICATIONS

Shoichiro Kawashima, et al. "Bitline GND Sensing Technique for Low-Voltage Operation FeRAM", IEEE Journal of Solid-State Circuits, vol. 37, No. 5, May 2002, pp. 592-598.

Ryu Ogiwara, et al. "A 0.5-um, 3-V, 1T1C, 1-Mbit FRAM with a Variable Reference Bit-Line Voltage Scheme Using a Fatigue-Free Reference Capacitor", IEEE Journal of Solid-State Circuits, vol. 35, No. 4, Apr. 2000, pp. 545-551.

Daisaburo Takashima, et al. "High-Density Chain Ferroelectric Random Access Memory (Chain FRAM)", IEEE Journal of Solid-State Circuits, vol. 33, No. 5, May 1998, pp. 787-792.

Shoichiro Kawashima, et al. "Bitline GND Sensing Technique for Low-Voltage Operation FeRAM", IEEE Journal of Solid-States Circuits, vol. 37 No. 5, May 2002, pp. 592-598.

* cited by examiner

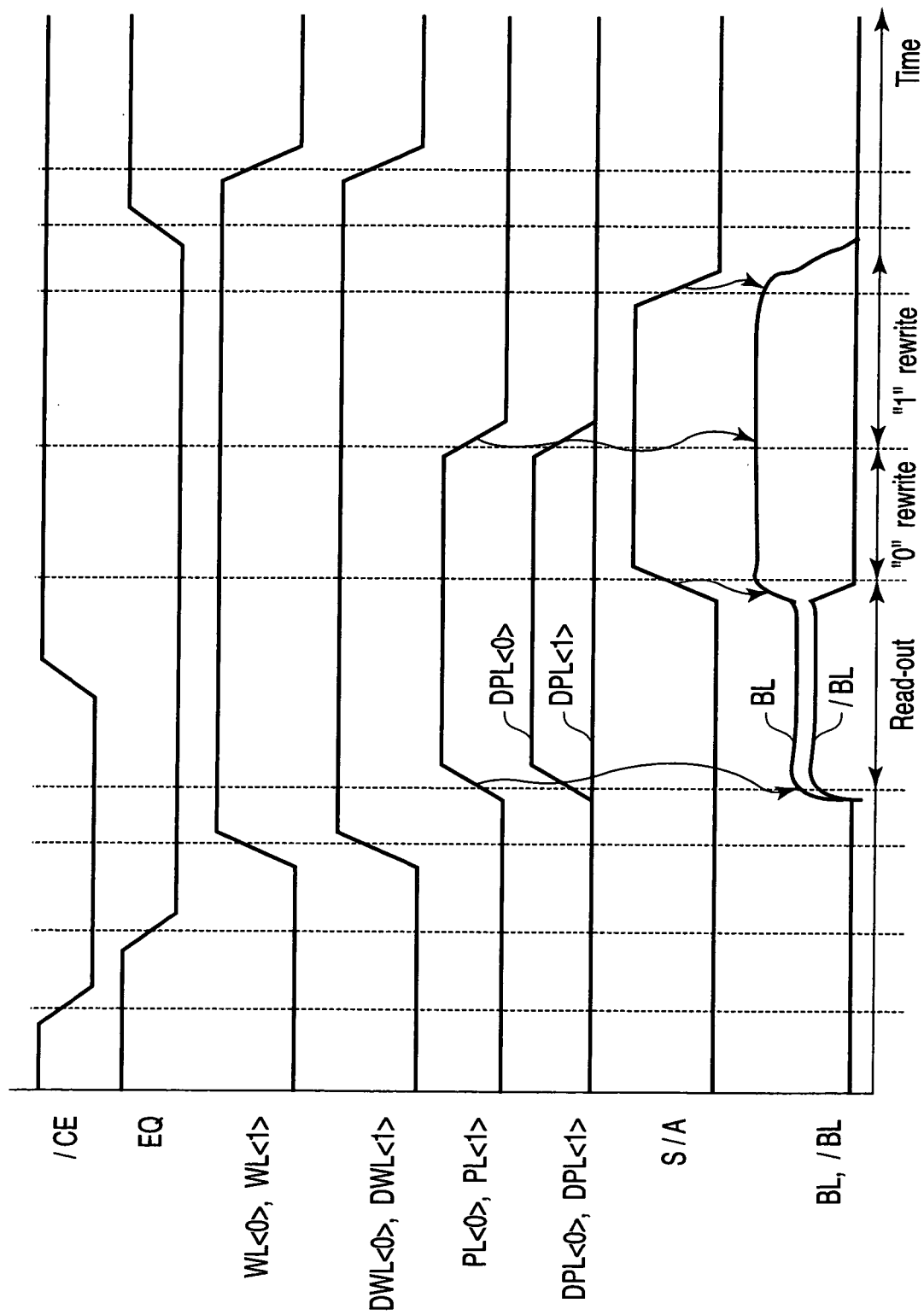
F I G. 6

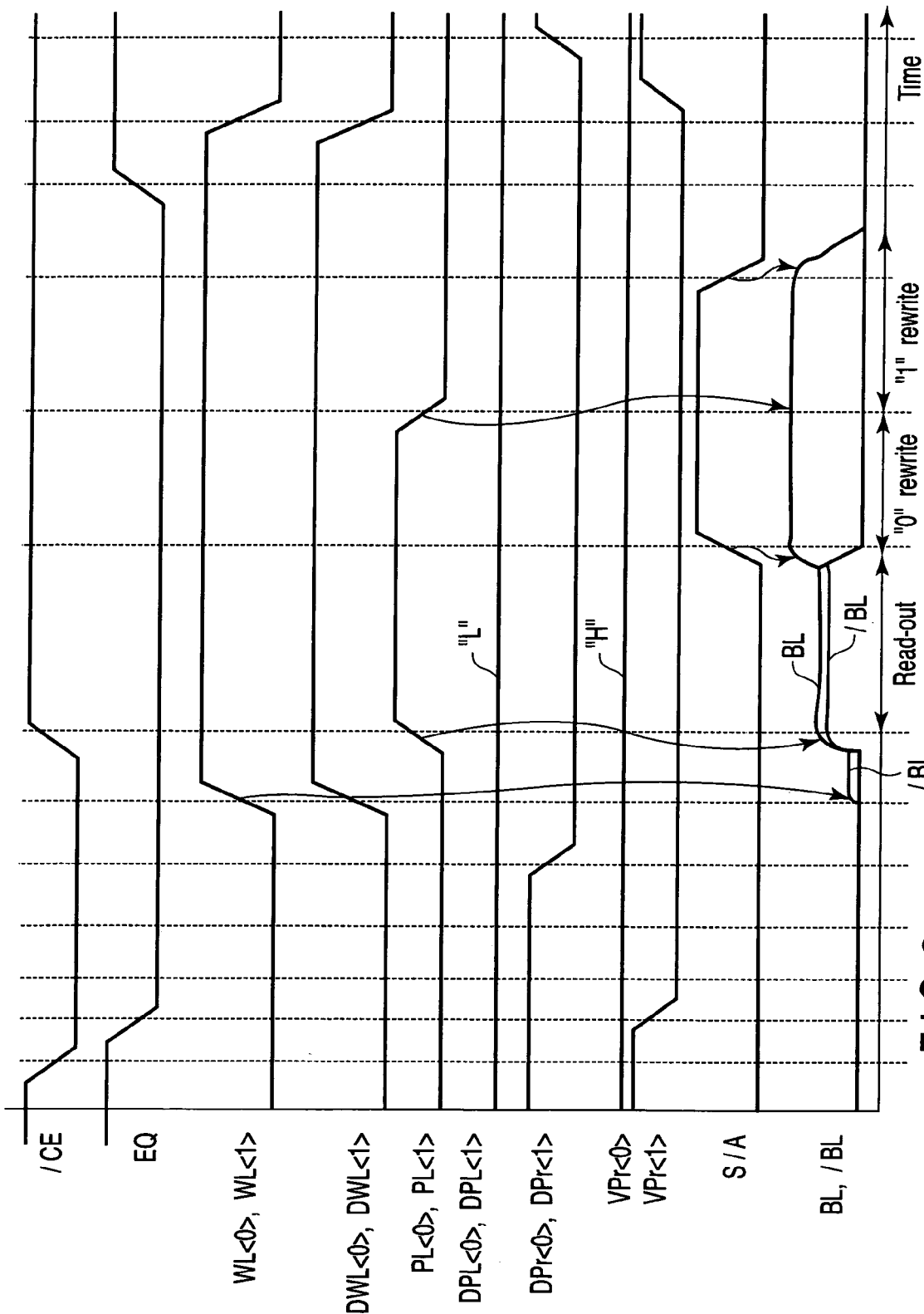
F I G. 8 though an electric field is not applied and in which the direction of
SEMICONDUCTOR STORAGE DEVICE

CROSS-REFERENCE TO RELATED APPLICATIONS

This application is based upon and claims the benefit of priority from prior Japanese Patent Application No. 2004-282031, filed Sep. 28, 2004, the entire contents of which are incorporated herein by reference.

BACKGROUND OF THE INVENTION

1. Field of the Invention

The present invention relates to a semiconductor storage device, and in particular to a semiconductor storage device having a configuration and operation which can screen signal voltage distribution of stored data.

2. Description of the Related Art

With the prevalence of portable devices, nonvolatile memories have recently been used frequently in which memory contents are not erased even if the power is turned off. One of these nonvolatile memories is a ferroelectric memory (FeRAM) which stores data in ferroelectric capacitors, along with a flash memory, an SRAM and the like.

The ferroelectric memory is known to include a so-called 1T1C type which serially connects a memory transistor (T) and a ferroelectric capacitor (C) to configure a memory cell, and a 2T2C type in which the memory cells are complementarily arranged. Such a FeRAM has problems that an element area cannot be below $8F^2$ (F is the minimum line width in a design rule) in the case of a folded bit line scheme and that the operation speed is lower than a DRAM because plate lines with large capacitance are driven.

In order to solve these problems, a (chain-type) ferroelectric memory having a series connection of TC parallel-connection units has also been devised in which the memory transistor and the ferroelectric capacitor are connected in parallel and units thereof are serially connected in a chain form, and its configuration and operation are described in detail, for example, in Jpn. Pat. Appln. KOKAI Publication No. 2000-339973 by the present inventors. It is to be noted that this Published Japanese Patent discloses a novel configuration which can reduce the storage polarization amount of the memory cells and occurrence of disturbance.

The ferroelectric memory is a memory utilizing hysteresis characteristics of ferroelectrics in which polarization caused when an electric field is applied remains even when the electric field is not applied and in which the direction of polarization is reversed when an electric field opposite to the above electric field is applied. While "1", "0" are stored in the direction of the polarization, whether predetermined data "1", "0" can be written or read in each memory cell is tested during manufacture of the ferroelectric memory, thereby judging if a product is good or not. In conventional methods, even if a memory cell is judged to be a good product, it is unclear what operation margin the memory cell has.

To solve the above-described problems, for example, Jpn. Pat. Appln. KOKAI Publication No. 2002-216498 quantitatively measures a bit line voltage due to remnant polarization of the ferro-electric capacitor of the ferro-electric memory to enable evaluation of characteristic displacement of the ferroelectric capacitor and the degree of deterioration.

As described above, the ferroelectric memory stores "0", "1" in the direction of polarization of the ferroelectric, but "0", "1" are formed with distributions in one chip due to irregular manufacturing conditions involved with positional problems in the chip. Thus, those products in which "0" adjoins "1" and the operation margin is thus not sufficient pass the test, and this might cause reliability problems later on.

It has therefore been desired to realize a semiconductor storage device which can screen those with a narrow operation margin in signal voltage distribution of binary data.

BRIEF SUMMARY OF THE INVENTION

According to a first aspect of the invention, there is provided a semiconductor storage device which comprises:
a first word line and a second word line extending in a first direction;
a first bit line and a second bit line extending in a second direction intersecting with the first direction;
a first memory cell connected to the first word line and the first bit line;
a second memory cell connected to the second word line and the second bit line;
a sense amplifier connected between the first bit line and the second bit line;
a first capacitor having a first storage electrode and a first plate electrode, the first storage electrode being connected to the first bit line;
a second capacitor having a second storage electrode and a second plate electrode, the second storage electrode being connected to the second bit line;
a first wire connected to the first plate electrode of the first capacitor; and
a second wire connected to the second plate electrode of the second capacitor,
wherein the first bit line and the second bit line are in a complementary relation, and when "0" is read to the first bit line, the first capacitor has an operation to increase a potential of the first plate electrode through the first wire before the sense amplifier operates.

According to a second aspect of the invention, there is provided a semiconductor storage device which comprises:
a first word line and a second word line extending in a first direction;
a first bit line and a second bit line extending in a second direction intersecting with the first direction;
a first memory cell connected to the first word line and the first bit line;
a second memory cell connected to the second word line and the second bit line;
a sense amplifier connected between the first bit line and the second bit line;
a first MOS transistor having a first conductive path and a first gate electrode, one end of the first conductive path being connected to the first bit line;
a second MOS transistor having a second conductive path and a second gate electrode, one end of the second conductive path being connected to the second bit line;
a first dummy word line connected to the first gate electrode;
a second dummy word line connected to the second gate electrode;
a first capacitor having a first storage electrode and a first plate electrode, the first storage electrode being connected to the other end of the first conductive path;
a second capacitor having a second storage electrode and a second plate electrode, the second storage electrode being connected to the other end of the second conductive path;
a first pre-charger connected to the first storage electrode of the first capacitor;

a second pre-charger connected to the second storage electrode of the second capacitor;
a first dummy plate line connected to the first plate electrode of the first capacitor; and
a second dummy plate line connected to the second plate electrode of the second capacitor,
wherein the first bit line and the second bit line are in a complementary relationship, and when "0" is read to the first bit line, a charge previously given to the first pre-charger is injected to the first bit line before the sense amplifier operates.

BRIEF DESCRIPTION OF THE SEVERAL VIEWS OF THE DRAWING

FIG. 6 is an operation timing chart of the semiconductor storage device according to the first embodiment;
FIG. 8 is an operation timing chart of the semiconductor storage device according to the second embodiment.

DETAILED DESCRIPTION OF THE INVENTION

According to embodiments of the present invention hereinafter described, in a semiconductor storage device complementarily storing "0" and "1" in a memory cell array, a predetermined potential is added to "0" before detection by a sense amplifier, so that data different from written data is read from a cell with a narrow operation margin between "0" and "1". It is thus possible to effectively eliminate chips including such cells with a narrow operation margin.

Figure 1:
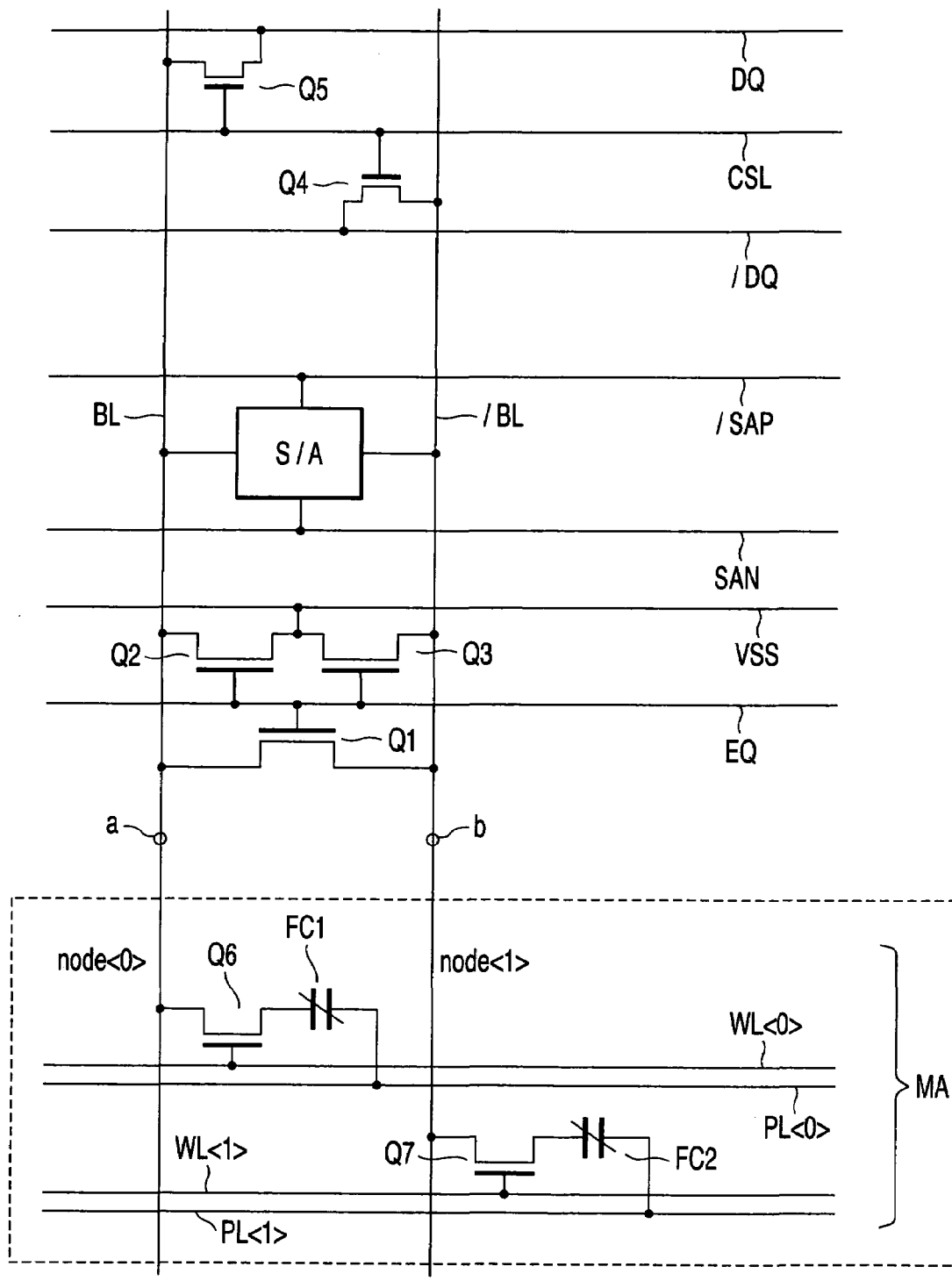
FIG. 1 is a circuit diagram of a conventional 2T2C type ferroelectric memory.

Before describing the embodiments, a conventional ferroelectric memory will be briefly described. FIG. 1 is a schematic circuit diagram showing a configuration of the ferroelectric memory. There are arranged a memory cell array MA comprising 2T2C (two transistors (Q6, Q7) two capacitors (FC1, FC2)) in a lower part of the drawing, an equalizer comprising a sense amplifier S/A and MOS transistors Q1 to Q3 in a central part of the drawing, and a DQ gate comprising transistors Q4, Q5 in an upper part of the drawing, etc.

Figure 2:
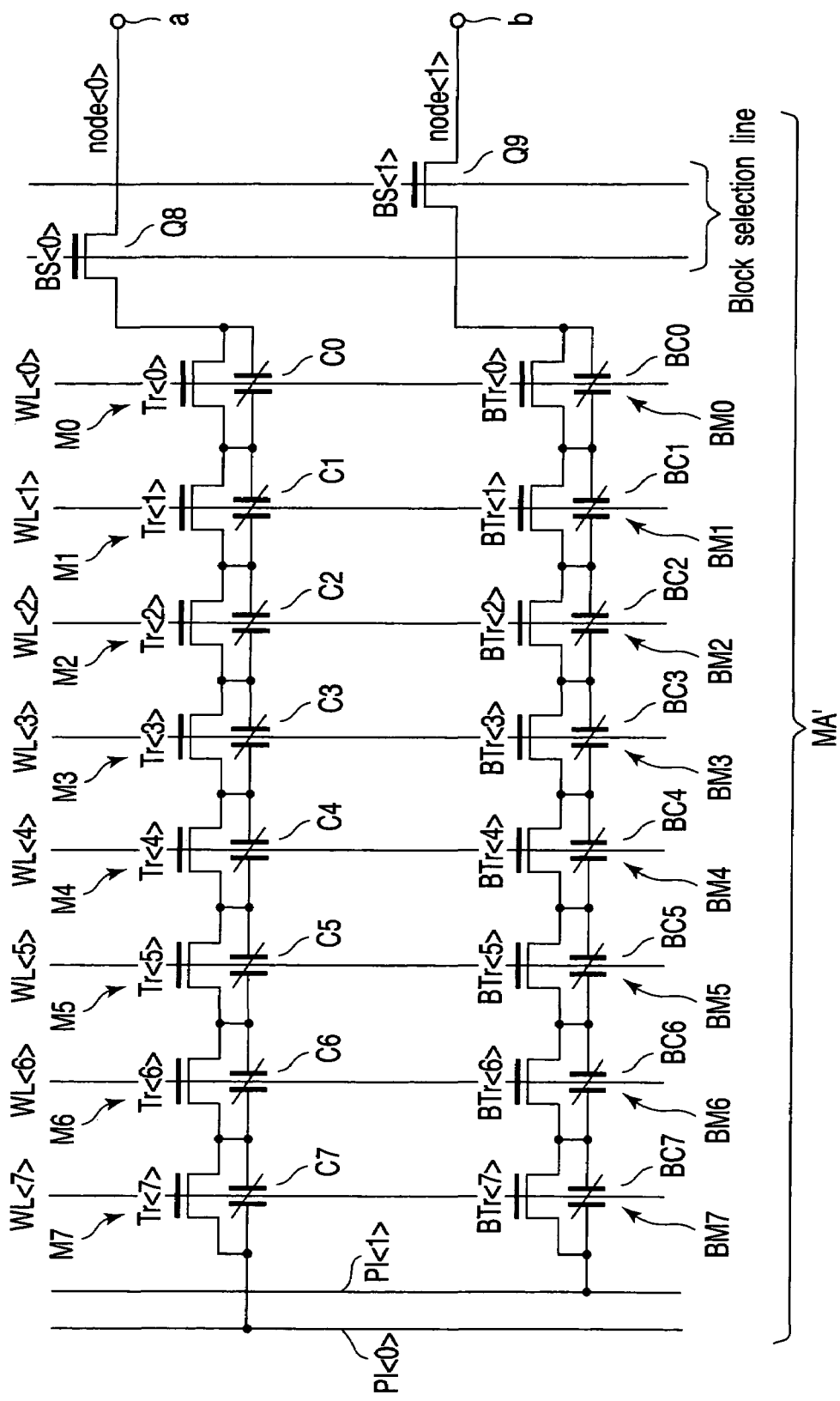
FIG. 2 is a circuit diagram of a conventional memory cell array of a chain-type ferroelectric memory.

In addition, the memory cell array may be replaced with a (chain-type) memory cell array MA' having a series connection of TC parallel-connection units shown in FIG. 2. In that case, nodes a, b of FIG. 2 may be connected to nodes a, b of FIG. 1.

Here, a configuration of the memory cell unit having the series connection of TC parallel-connection units in FIG. 2 will be briefly described. The memory cell units shown in FIG. 2 are arranged in matrix form in a memory cell area of a memory chip. This memory cell unit serially connects a plurality of memory cells in which both electrodes of the ferroelectric capacitor are connected to both ends (source, drain) of a conductive path of an NMOS transistor.

The example of FIG. 2 represents a memory cell unit in which eight memory cells M0 to M7, BM0 to BM7 are connected in series, wherein Tr<0> to Tr<7> indicate transistors of the cells M0 to M7, and C0 to C7 indicate capacitors thereof, while BTr<0> to BTr<7> indicate transistors of the cells BM0 to BM7, and BC0 to BC7 indicate capacitors thereof.

Word lines WL<0> to WL<7> are correspondingly connected to gates of the transistors Tr<0> to Tr<7>, BTr<0> to BTr<7>, and one end of the memory cell unit is connected to a plate line Pl<0> or PL<1>, while the other end is connected to a bit line BL or a bit line /BL complementary thereto via MOS transistors Q8, Q9 for block selection and the nodes a, b. In the above-described configuration, all the word lines are brought high and the capacitors to which the transistors are connected in parallel are in a short-circuited state during standby, but if, for example, the WL<0> is brought low in this state, the cells M0 and BM0 will be selected, so that data can be read as in a 2T2C mode of the DRAM memory cell array shown in FIG. 1.

Figure 3:
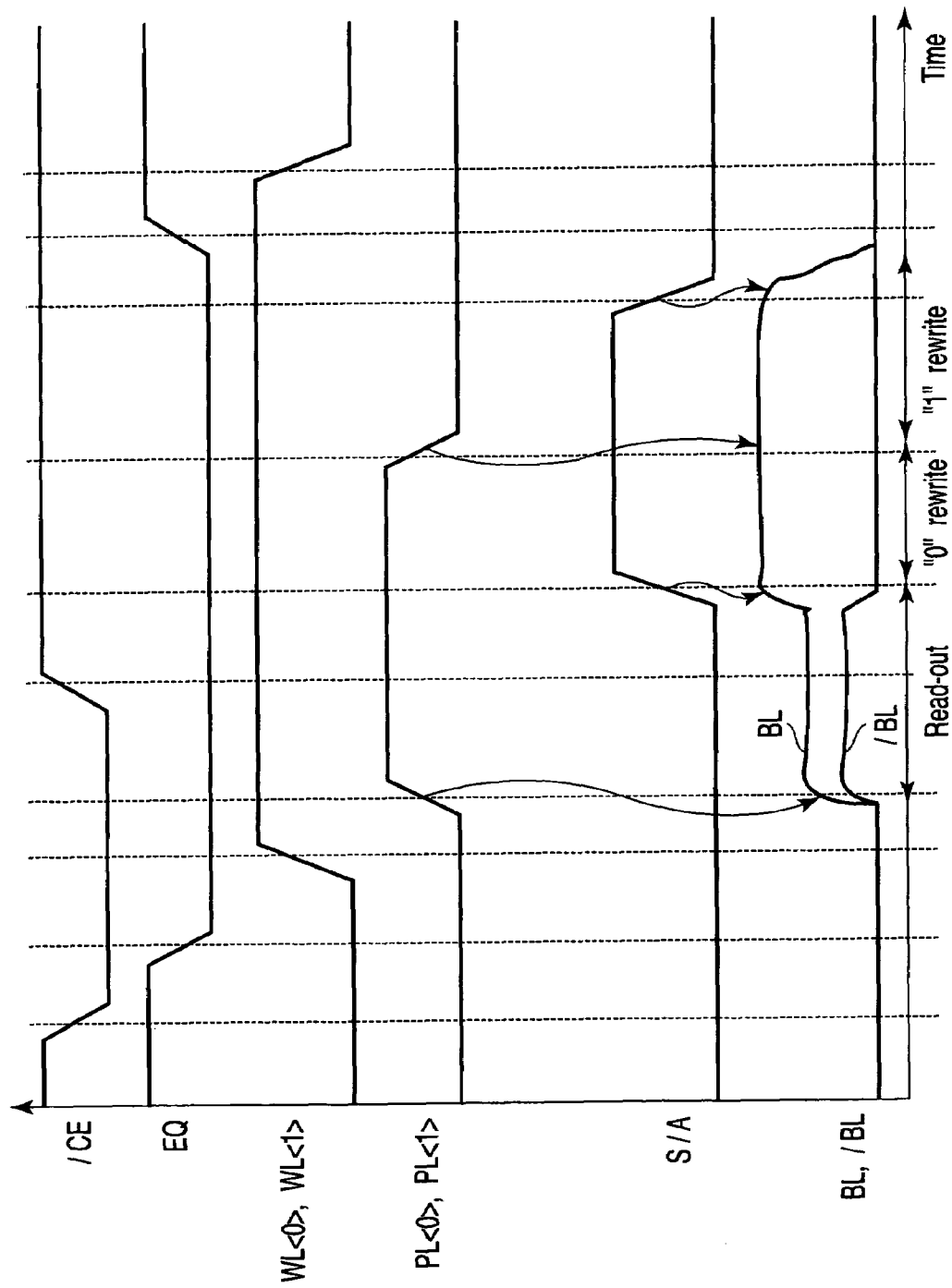
FIG. 3 is an operation timing chart of the ferroelectric memory of FIG. 1.

Here, referring to FIGS. 1 and 3, a case will be considered in which a signal is read from the memory cell array in accordance with the 2T2C mode in a DRAM type memory cell array form shown in FIG. 1. As shown in an operation timing chart of FIG. 3, a memory area of the chip is first brought into an operable state by a chip enable signal /CE. Next, an equalize signal EQ becomes low to cancel an equalized state of the bit line, causing the bit line to be floating. Subsequently, the word lines WL<0>, WL<1> simultaneously become high such that the MOS transistors Q6, Q7 of FIG. 1 are turned on, and then the plate lines PL<0>, PL<1> simultaneously become high such that a set of two signals are read to the bit line BL and the bit line /BL complementary thereto. "1" is stored in one side of the memory cell and "0" in another side, and these data can be read without supplying a reference potential. Subsequently, the sense amplifier S/A is activated such that "0" is rewritten and the plate lines PL<0>, PL<1> become low, resulting in rewriting of "1". This is the outline of operation in the conventional 2T2C mode.

Figure 4:
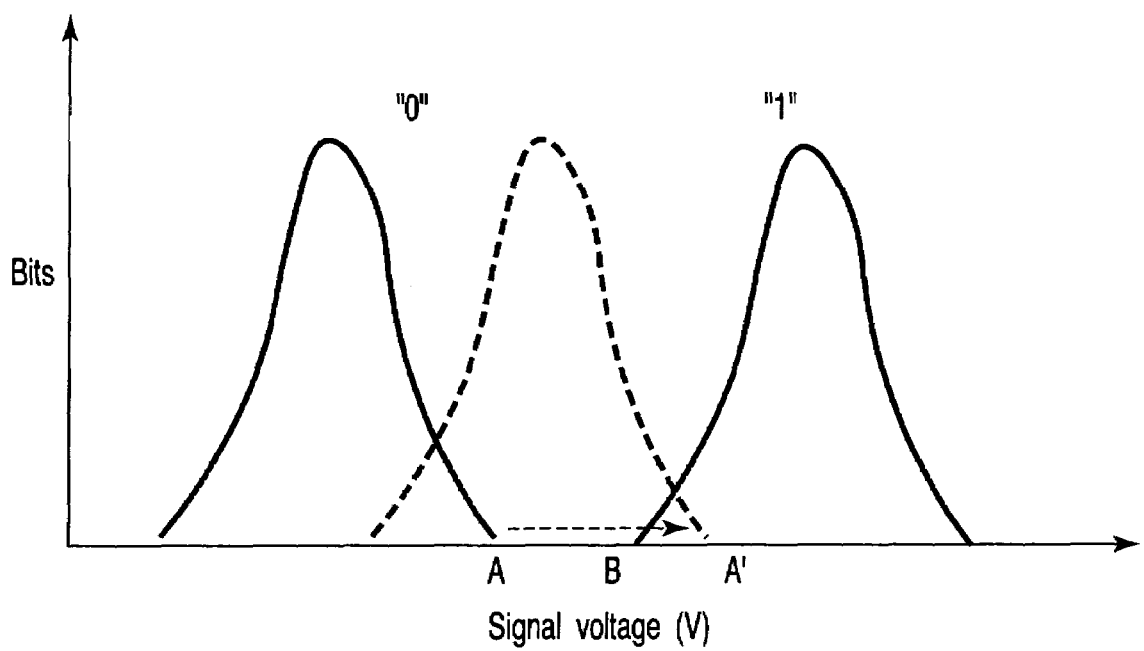
FIG. 4 is a signal voltage distribution diagram exemplifying a concept of a screening method of the present invention.

Next, a basic concept of the following embodiments of the present invention will be described. As shown in FIG. 4, one chip has a distribution with certain variations in signal potentials of the memory cells. Here, a distribution of a "0"

signal is shifted to the side of a "1" signal having a certain potential, and is subjected to comparison amplification by the sense amplifier, as shown in FIG. 4. In a pair of complementary signals read at this moment, if the "1" signal is located at the bottom of the signal potential distribution and has a low signal voltage, and if the "0" signal is located at the top of the signal potential distribution and has a high signal voltage, and becomes higher than the "1" signal after augmentation, a signal read by the sense amplifier will be a signal different from (opposite to) the written signal. Such augmentation of "0" causes proximity of "0" to "1", and a pair of cells with a narrow operation margin is judged to be defective, thereby making it possible to screen chips containing such a cell pair.

As described above, driving a dummy capacitor used in a 1T1C mode can be conceived as means for shifting the "0" signal voltage. As described above, the dummy capacitor is not used because the reference potential is unnecessary in the 2T2C mode, but this is used as the means for shifting the "0" signal voltage distribution.

This dummy capacitor is connected to the bit line via the NMOS transistor, and this NMOS is turned on to connect the bit line and the dummy capacitor, and then a potential on the side of a plate electrode of the dummy capacitor is increased, so that a potential of the bit line can be increased by coupling. It is to be noted that the dummy capacitor may be directly connected to the bit line without involving the NMOS transistor.

Methods of generating the reference potential in the 1T1C mode include the following three:

(1) A dummy word line is turned on, and the dummy capacitor and the bit line are connected, and then the potential of the plate electrode of the dummy capacitor is increased, so that the potential of the bit line is increased by coupling.

(2) In a configuration in which the dummy capacitor is connected to the bit line via the NMOS transistor, a certain charge is previously obtained from the side of a storage electrode of the dummy capacitor, and the NMOS transistor is then turned on to connect the dummy capacitor and the bit line, thereby injecting a charge into the bit line.

(3) In the configuration in which the dummy capacitor is connected to the bit line via the NMOS transistor, a certain charge is previously obtained from the side of the storage electrode of the dummy capacitor, and the NMOS transistor is then turned on to connect the dummy capacitor and the bit line, and the potential on the side of the plate electrode of the dummy capacitor is increased to increase the potential of the bit line. While this increased potential is used as the reference potential, the method of 3 has an advantage that a higher reference potential can be obtained than in the methods of 1 and 2.

It is to be noted that if the above-described dummy capacitor is connected only to the bit line where the "0" signal is read, a bit line capacity $C_B$ and a capacity $C_D$ of the dummy capacitor cause redistribution of a "0" signal voltage charge Q "0" and the bit line potential is decreased, so that such a problem can be anticipated that a voltage increase of the bit line due to the voltage increase of the plate electrode of the dummy capacitor is reduced to prevent a sufficient screening test from being performed.

The present invention proposes a semiconductor storage device having a function to effectively detect the cells with a narrow operation margin between "0" and "1" as described above. The embodiments of the present invention will be described below referring to the drawings.

First Embodiment

Figure 5:
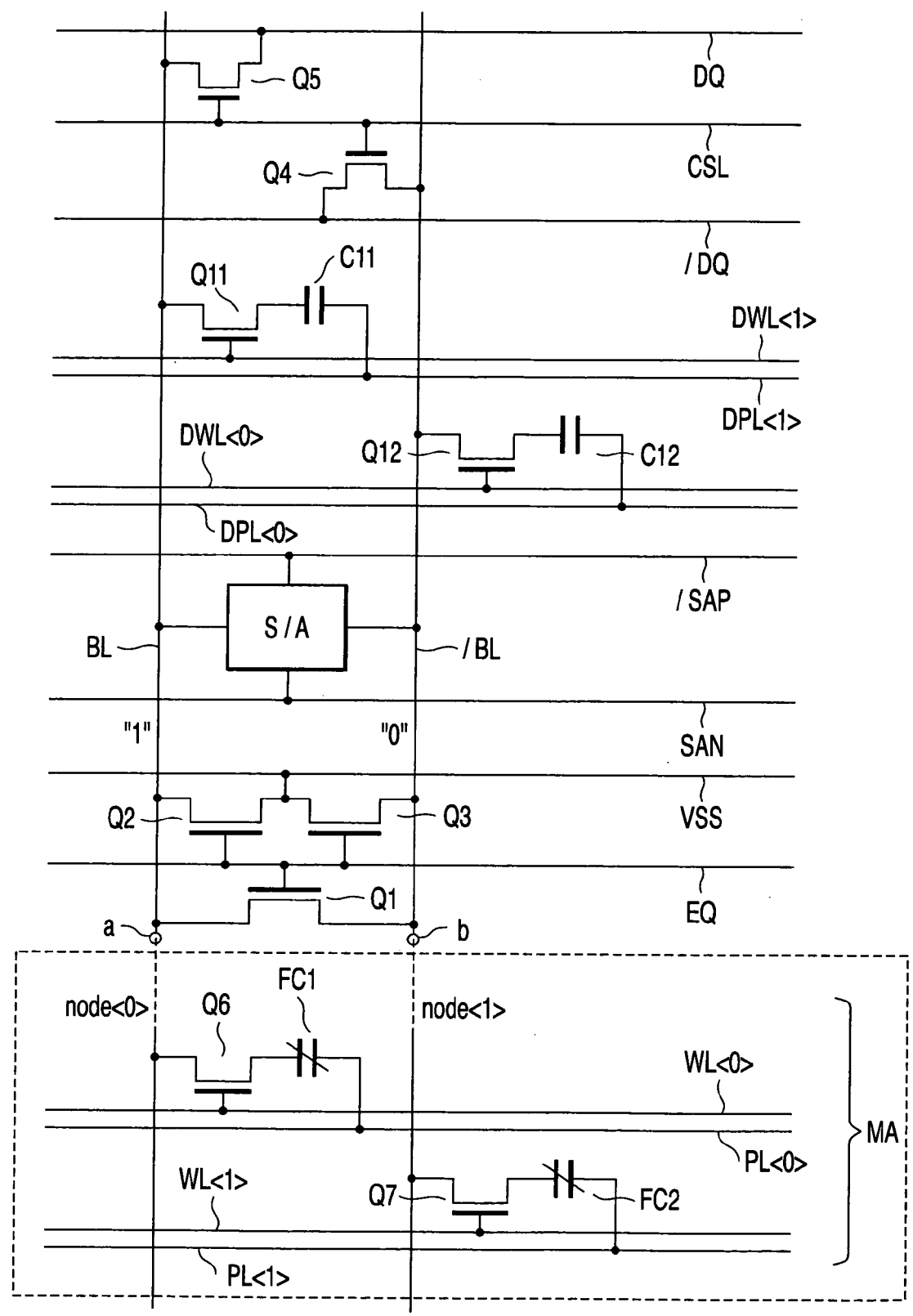
FIG. 5 is a circuit diagram of a semiconductor storage device according to a first embodiment of the present invention.

FIG. 5 is a circuit diagram of the semiconductor storage device according to a first embodiment of the present invention, and FIG. 6 is a timing chart of its operation. The first embodiment employs the method of (1) described above, wherein in the 2T2C mode, a complementary signal is read from the memory cell array to a pair of bit lines, and a "0" signal voltage distribution of the first bit line where the "0" signal is read is potentially shifted toward a "1" signal voltage distribution of the second bit line where the complementary "1" signal is read, and this is then sensed by the sense amplifier, thereby screening the chips with a narrow operation margin.

FIG. 5 is analogous to FIG. 1 described above, but is different in that a first dummy capacitor C11 is connected to the bit line BL via a MOS transistor Q11 and that a second dummy capacitor C12 is connected to the bit line /BL via a MOS transistor Q12. Plate electrodes of the dummy capacitors C11, 12 are connected to dummy plate lines DPL<1>, DPL<0>, respectively, and gates of the MOS transistors Q11, Q12 are connected to dummy word lines DWL<1>, <0>, respectively. Others are the same as those in FIG. 1, and the same reference numerals are given to the same parts as in FIG. 1 for easier understanding.

In the first embodiment, for example, the dummy word line DWL<1> is also turned on which is connected to the bit line BL where the "1" signal is read, and the dummy capacitor C11 on this side is also connected to the bit line BL. In this way, capacitances which are newly added when the dummy word lines DWL<0>, DWL<1> are turned on are equalized in both the bit lines BL, /BL, and reductions of potentials due to the redistribution of a charge can also be substantially equal between the bit line /BL where "0" is read and the bit line BL where "1" is read. Subsequently, the dummy capacitor 12 connected to the bit line /BL where the "0" signal is read is driven by the dummy plate line DPL<0>, so that the "0" signal voltage distribution alone can be shifted toward the "1" signal voltage distribution.

A specific operation procedure will be described with reference to FIG. 6. After the chip enable signal /CE is input, the equalize signal EQ is broughtlow, and the equalized state is cancelled, which causes the bit line pair to be floating. Subsequently, the word lines WL<0>, WL<1> and the dummy word lines DWL<0>, DWL<1> are simultaneously activated. It is assumed that, at this moment, the "1" signal is read to the bit line BL, and the "0" signal is read to the bit line /BL. Then, it is assumed that the plate lines PL<0>, PL<1> and the dummy plate line DPL<0> are brought high, and the dummy plate line DPL<1> remains low. The potential on the side of the plate electrode of the dummy capacitor C12 is increased so that the potential of the bit line /BL is increased by coupling. This state is expressed in a waveform of the /BL during reading in FIG. 6.

Subsequently, the sense amplifier S/A is activated such that "0" is rewritten and the plate line PL<1> is dropped to low, and rewriting of "1" is started.

As described above, the potential of the bit line /BL is augmented and comes closer to the potential of the bit line BL during a data read period, so that if this is sensed, the memory cells with a low operation margin makes erroneous operation, and these can therefore be detected effectively. It is to be noted that the "0" signal is read to the bit line /BL in the above description, but this is merely an illustration, and similar applications are possible when the "0" signal is read to the bit line BL. This holds true with the embodiments below.

Second Embodiment

Figure 7:
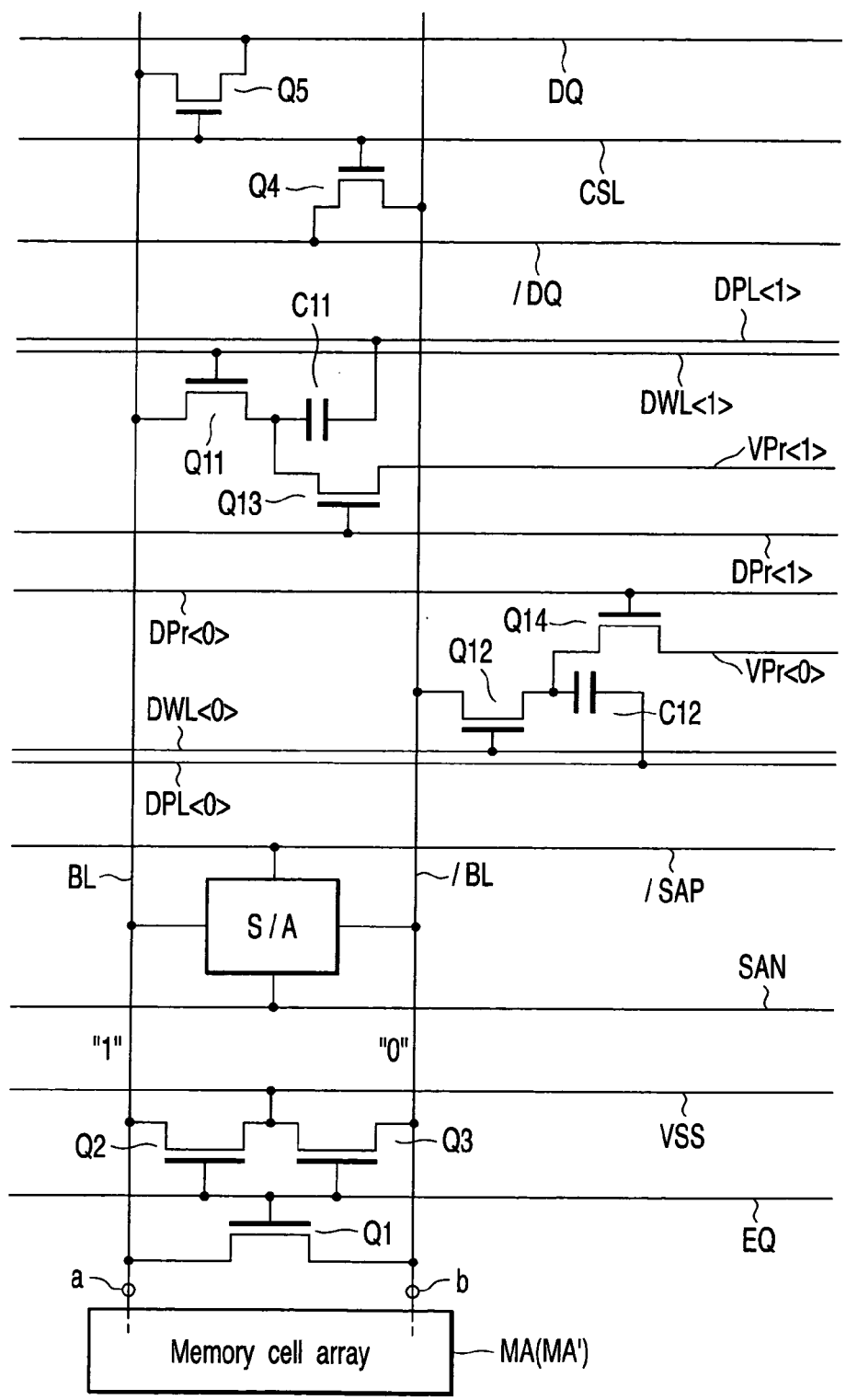
FIG. 7 is a circuit diagram of the semiconductor storage device according to a second embodiment.

FIG. 7 is a circuit diagram of the semiconductor storage device according to a second embodiment of the present invention, and FIG. 8 is a timing chart of its operation. The second embodiment embodies the method of (2) mentioned above. The difference from the first embodiment of FIG. 5 is that a MOS transistor Q13 is added in which one end (drain) of a conductive path is connected to a connecting node between one end (source) of the conductive path of the MOS transistor Q11 controlled by the dummy word line DWL<1> and a storage electrode of the dummy capacitor C11 and in which a dummy pre-charge line DPr<1> is connected to a gate, and that a MOS transistor Q14 is added in which one end (drain) of a conductive path is connected to a connecting node between one end (source) of the conductive path of a MOS transistor Q12 controlled by the dummy word line DWL<0> and a storage electrode of the dummy capacitor C12 and in which a dummy pre-charge line DPr<0> is connected to a gate.

The VPr<0> is maintained at a potential VPr (high) only for the dummy capacitor C12 connected to the bit line /BL where the "0" signal is read such that the dummy capacitor C12 is pre-charged with the positive potential VPr through the storage electrode when the DPr<0> is high, and a VPr<1> is brought to VSS for the dummy capacitor C11 where the "1" signal is read such that the capacitor C11 is pre-charged with 0 V when the DPr<1> is high.

First, the dummy word line DWL<0> connected to the bit line /BL where the "0" signal is read is turned on, and a charge is passed toward the bit line /BL, thereby raising the "0" signal voltage distribution.

Furthermore, the dummy word line DWL<1> connected to the bit line BL where the "1" signal is read is turned on, and the dummy capacitor C11 on this side is also connected to the bit line BL. In this way, capacitances which are newly added when the dummy word lines DWL<1>, DWL<0> are turned on are equalized in the bit lines BL, /BL, and a reduced amount due to the redistribution of the charge can be cancelled. This allows the "0" signal voltage distribution to be closer to the "1" signal voltage distribution.

A detail operation will be described referring to FIG. 8. After the chip enable signal /CE is input, the equalize signal EQ is brought low, and the equalized state is cancelled, which causes the bit line pair to be floating. Subsequently, the dummy pre-charge lines DPr<0>, DPr<0> are brought from high to low, and pre-charging through the MOS transistor Q13, Q14 is stopped, and then the word lines WL<0>, WL<1> and the dummy word lines DWL<0>, DWL<1> are simultaneously activated. At this moment, the "1" signal is read to the bit line BL, and "0" signal is read to the bit line /BL. Then, the plate lines PL<0>, PL<1> are brought high, and the dummy plate lines DPL<1>, DPL<0> remain low. An addition of a pre-charged amount to "0" read by bringing the PL<1> to high is read to the bit line /BL. This state is expressed in a waveform of the /BL during reading in FIG. 8.

Subsequently, the sense amplifier S/A is activated to bring the /BL to 0 V and the BL to VDD, such that "0" is rewritten and the plate line PL<1> is dropped to low, and rewriting of "1" is performed.

As described above, the second embodiment has pre-charge means comprising the Q13, Q14, wherein in reading data, the potential of the bit line /BL is the addition of the pre-charged potential amount of the dummy capacitor to "0" data potential and comes closer to the potential of the bit line BL where the "1" is read due to the pre-charge potential of the dummy capacitor, so that by sensing this, the chips with a low operation margin can be effectively removed.

Third Embodiment

Figure 9:
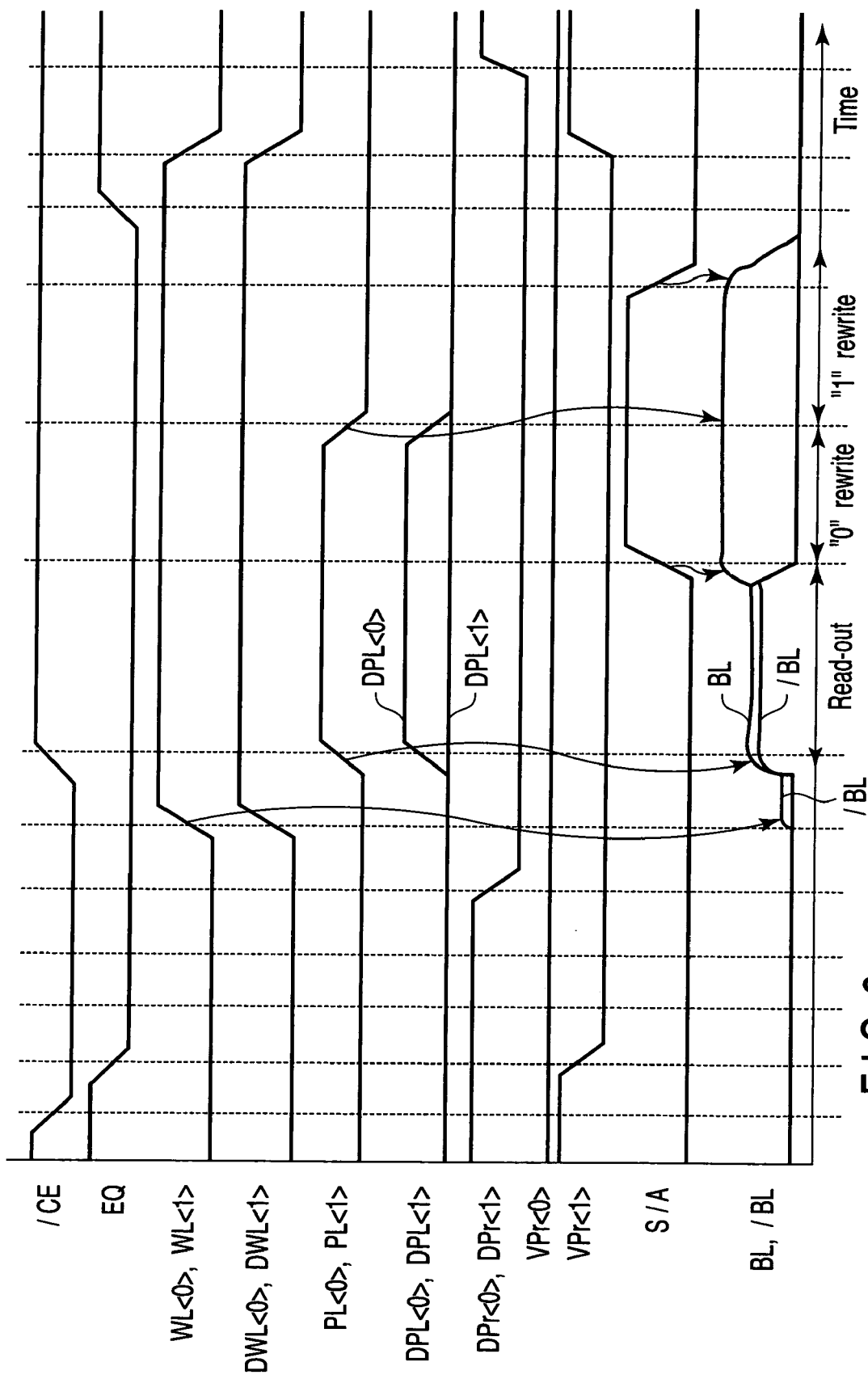
FIG. 9 is an operation timing chart of the semiconductor storage device according to a third embodiment.

A configuration in a third embodiment is the same as that in the second embodiment (FIG. 7), but the operation timing is different as shown in FIG. 9. The third embodiment is an application of the method of (3) mentioned above. More specifically, a VPr<0> is maintained at the potential VPr (high) only for the dummy capacitor C12 connected to the bit line /BL where the "0" signal is read such that the dummy capacitor C12 is pre-charged with the positive potential VPr when the DPr<0> is high, and the VPr<1> is brought to VSS for the dummy capacitor C11 where the "1" signal is read such that the capacitor C11 is pre-charged with 0 V when the DPr<1> is high.

First, the dummy word line DWL<0> connected to the bit line /BL where the "0" signal is read is turned on, and the potential of the dummy plate line DPL<0> connected to the plate electrode of the dummy capacitor C12 is increased, such that the charge previously obtained is passed toward the bit line /BL and the potential is additionally increased by coupling, thereby raising the potential of the "0" signal distribution to a large extent.

Furthermore, the dummy word line DWL<1> connected to the bit line BL where the "1" signal is read is turned on, and the dummy capacitor C11 on this side is also connected to the bit line BL. In such a configuration, capacitances which are newly added when the dummy word lines DWL<1>, DWL<0> are turned on are equalized in both the bit lines BL, /BL, and a reduced amount due to the redistribution of the charge can thus be cancelled. This allows the "0" signal voltage distribution to be closer to the "1" signal voltage distribution.

It is to be noted that the operation timing of FIG. 9 is different from that of FIG. 8 regarding the DPL<0> only, and redundant explanation is therefore omitted. In addition, both the DPL<0>, DPL<1> are always low in FIG. 8.

Fourth Embodiment

Figure 10:
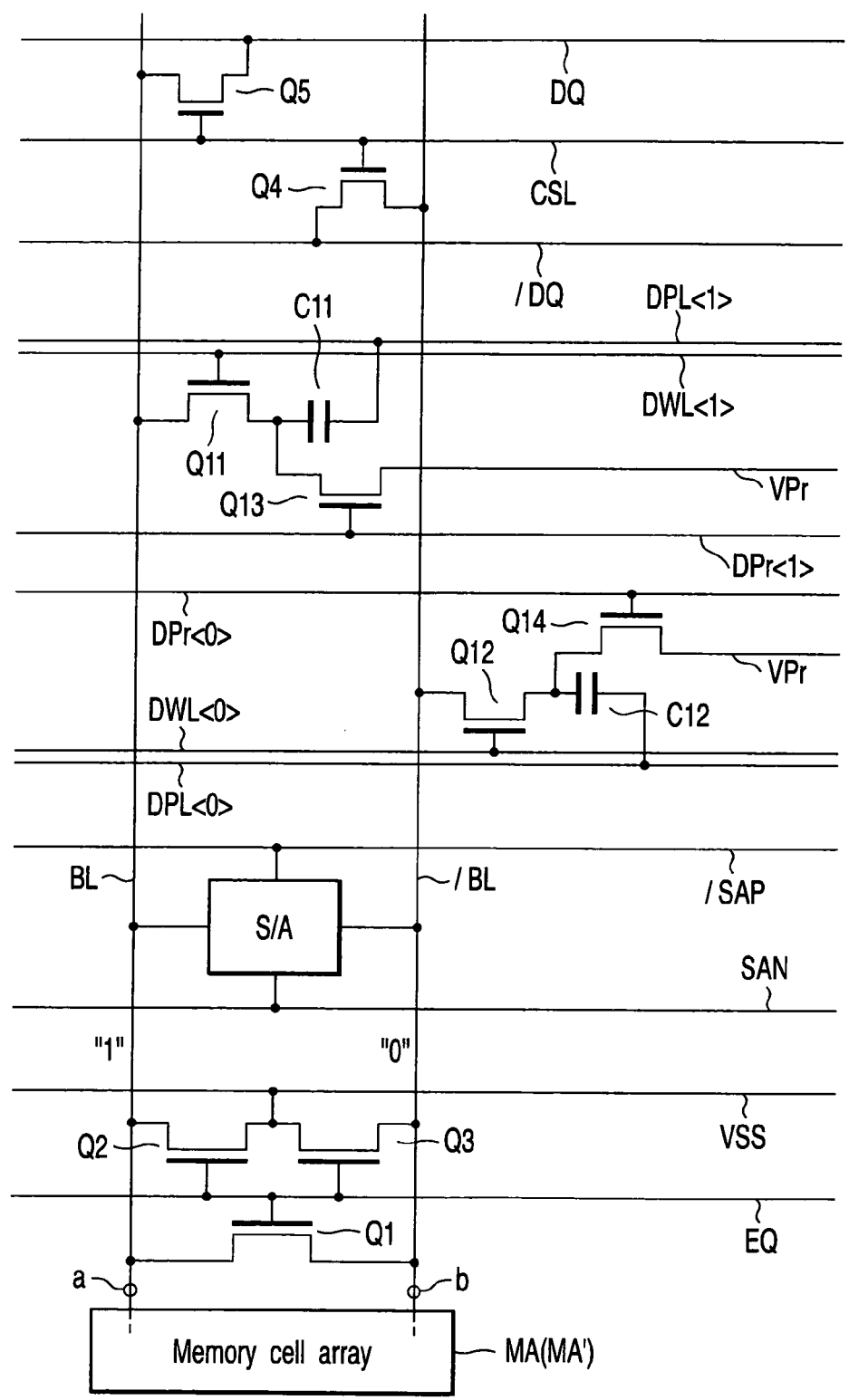
FIG. 10 is a circuit diagram of the semiconductor storage device according to a fourth embodiment.
Figure 11:
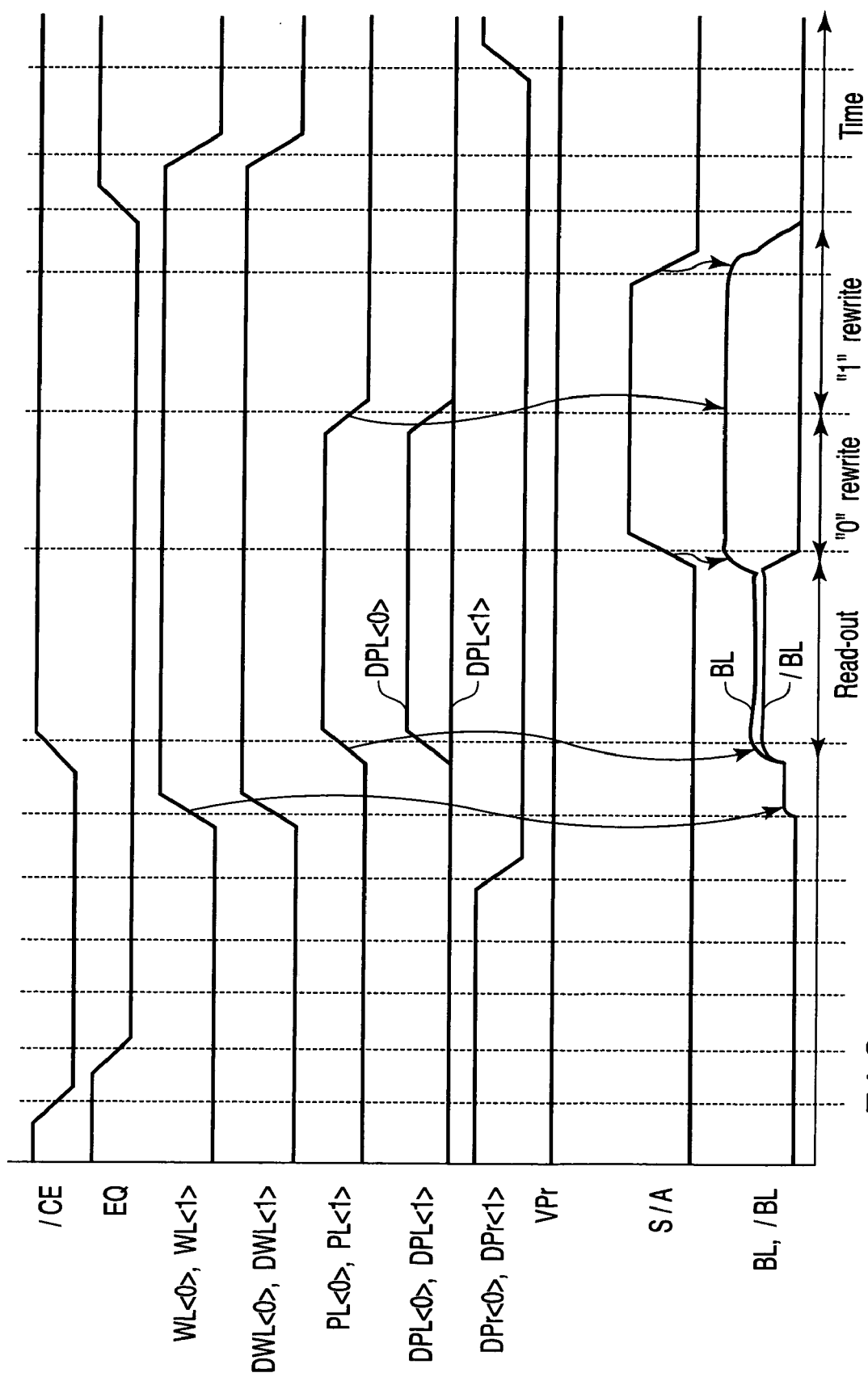
FIG. 11 is an operation timing chart of the semiconductor storage device according to the fourth embodiment of the present invention.

FIG. 10 shows a circuit diagram of the semiconductor storage device according to a fourth embodiment of the present invention, and FIG. 11 shows a timing chart of its operation. The present fourth embodiment concerns an application of the method of (3) mentioned above.

That is, the plate electrodes of the dummy capacitors C11, C12 connected to the bit lines BL, /BL where the "0" signal and "1" signal are read are pre-charged with the potential VPr (high). In the present embodiment, one pre-charge potential supply line is connected to the plate electrodes of the dummy capacitors for a reduction of chip area and for simplification of operation.

First, for example, the dummy word line DWL<0> connected to the bit line /BL where the "0" signal is read is turned on, and the potential of the plate electrode of the dummy capacitor C12 is increased through the DPL<0>, such that the charge previously given to the dummy capacitor C12 is passed toward the bit line /BL and the potential is additionally increased by coupling in accordance with the raising of the dummy plate line DPL<0>, thereby raising the "0" signal voltage distribution to a large extent.

Furthermore, the dummy word line DWL<1> connected to the bit line BL where the "1" signal is read is turned on, and the dummy capacitor C11 is also connected to the side of the bit line BL, whereby the charge previously given to the dummy capacitor C11 is also passed to the bit line BL, serving to increase the potential of the bit line BL.

The operation timing chart of FIG. 11 is the same as that of FIG. 9 except for the potential change of the VPr, and redundant explanation is thus omitted. The third embodiment (FIG. 9) is superior in that the "0" signal voltage distribution is brought closer to the "1" signal voltage distribution, but the fourth embodiment is characterized in that the number of pre-charge potential supply lines, through which the pre-charge is injected to both the bit lines BL, /BL, can be one, and the operation is simpler than that in the third embodiment described above.

Figure 12:
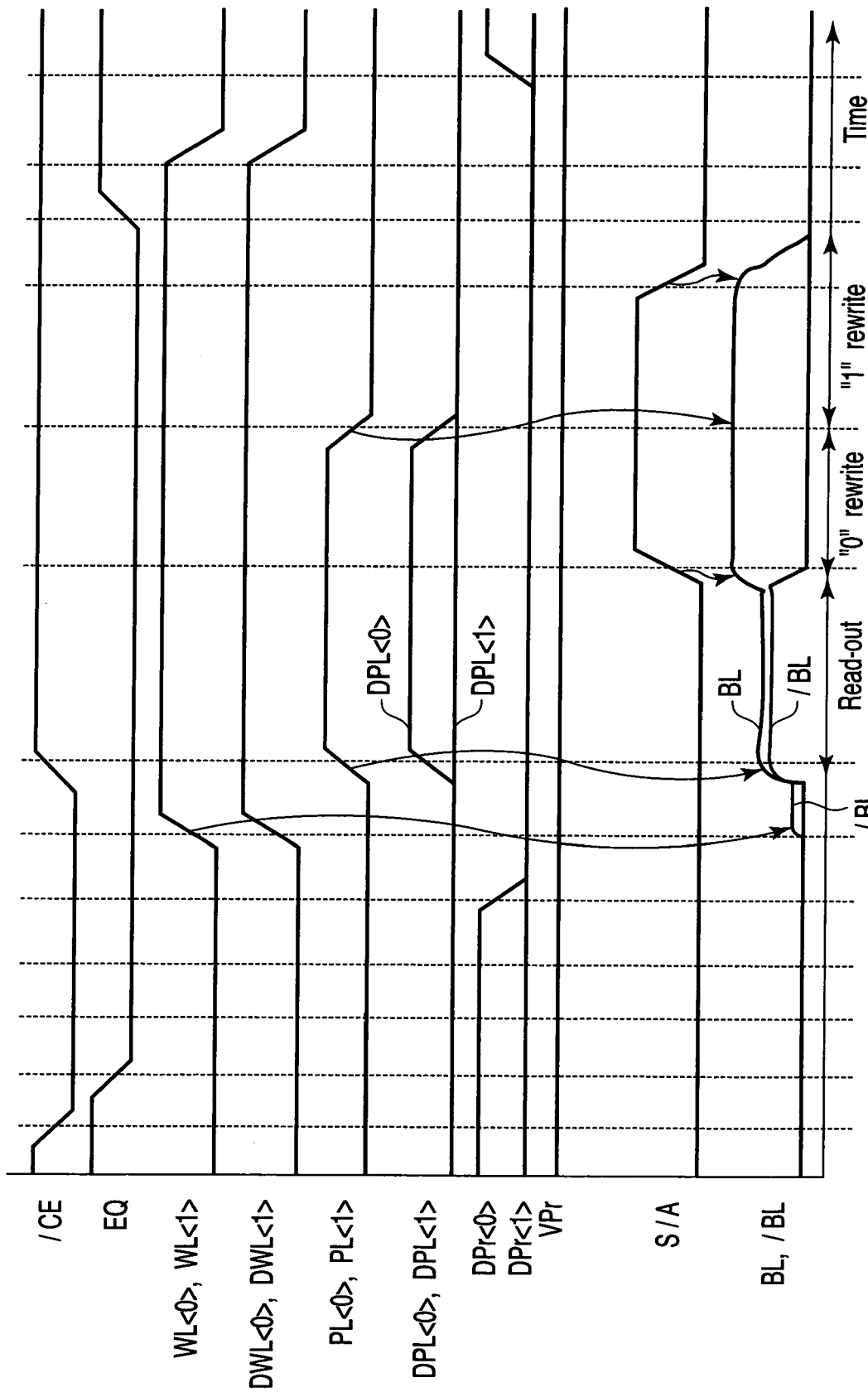
FIG. 12 is an operation timing chart of the semiconductor storage device according to a modification of the fourth embodiment.

FIG. 12 is an operation timing chart of a modification of the fourth embodiment, wherein the gate potential (DPr<1>) of the pre-charge transistor Q13 on the side connected to the bit line BL is always low. In this way, the pre-charge potential is not injected to the bit line BL where "1" is read, and similar effects to those in the third embodiment can be provided.

Fifth Embodiment

Figure 13:
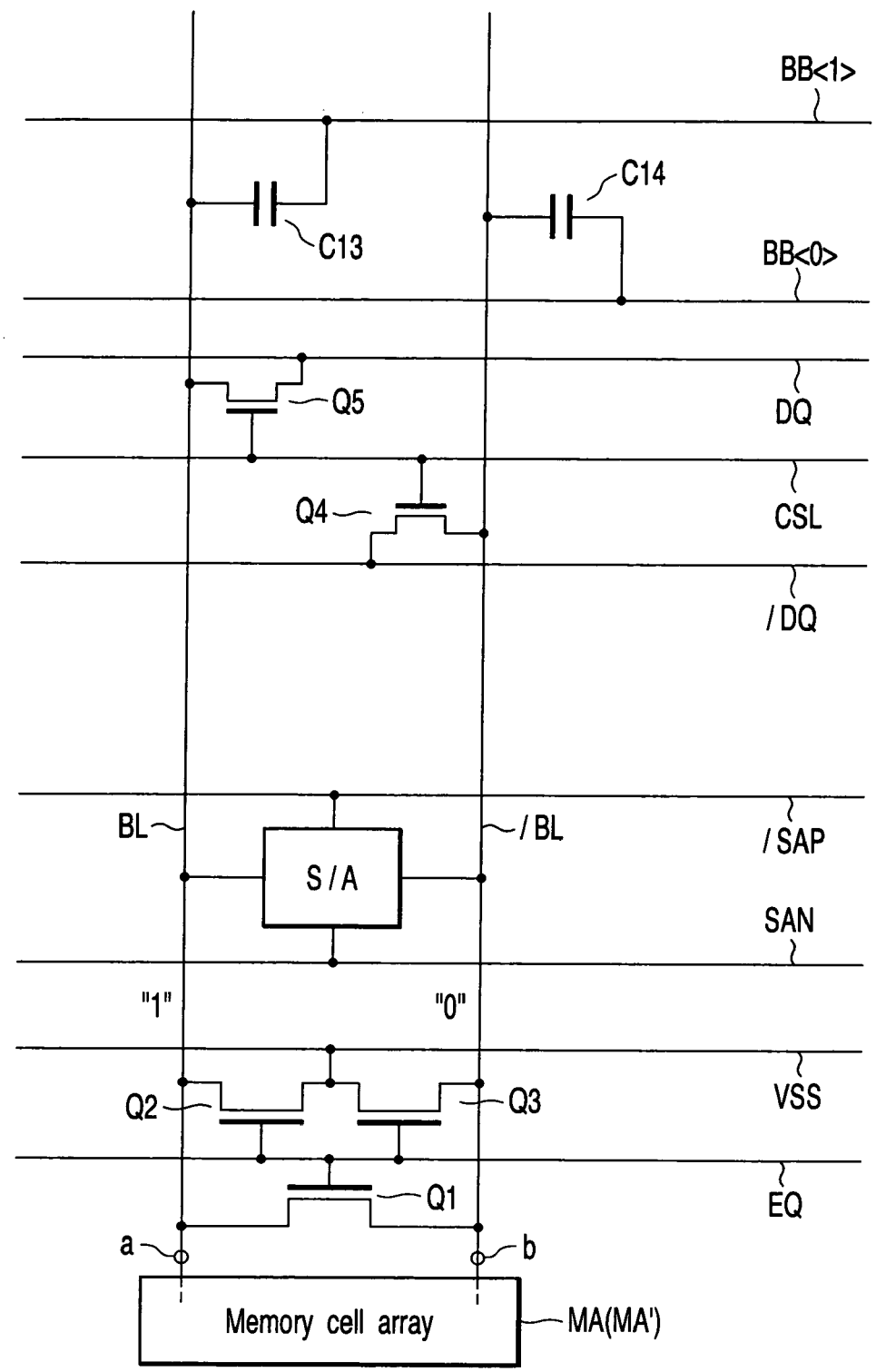
FIG. 13 is a circuit diagram of the semiconductor storage device according to a fifth embodiment.
Figure 14:
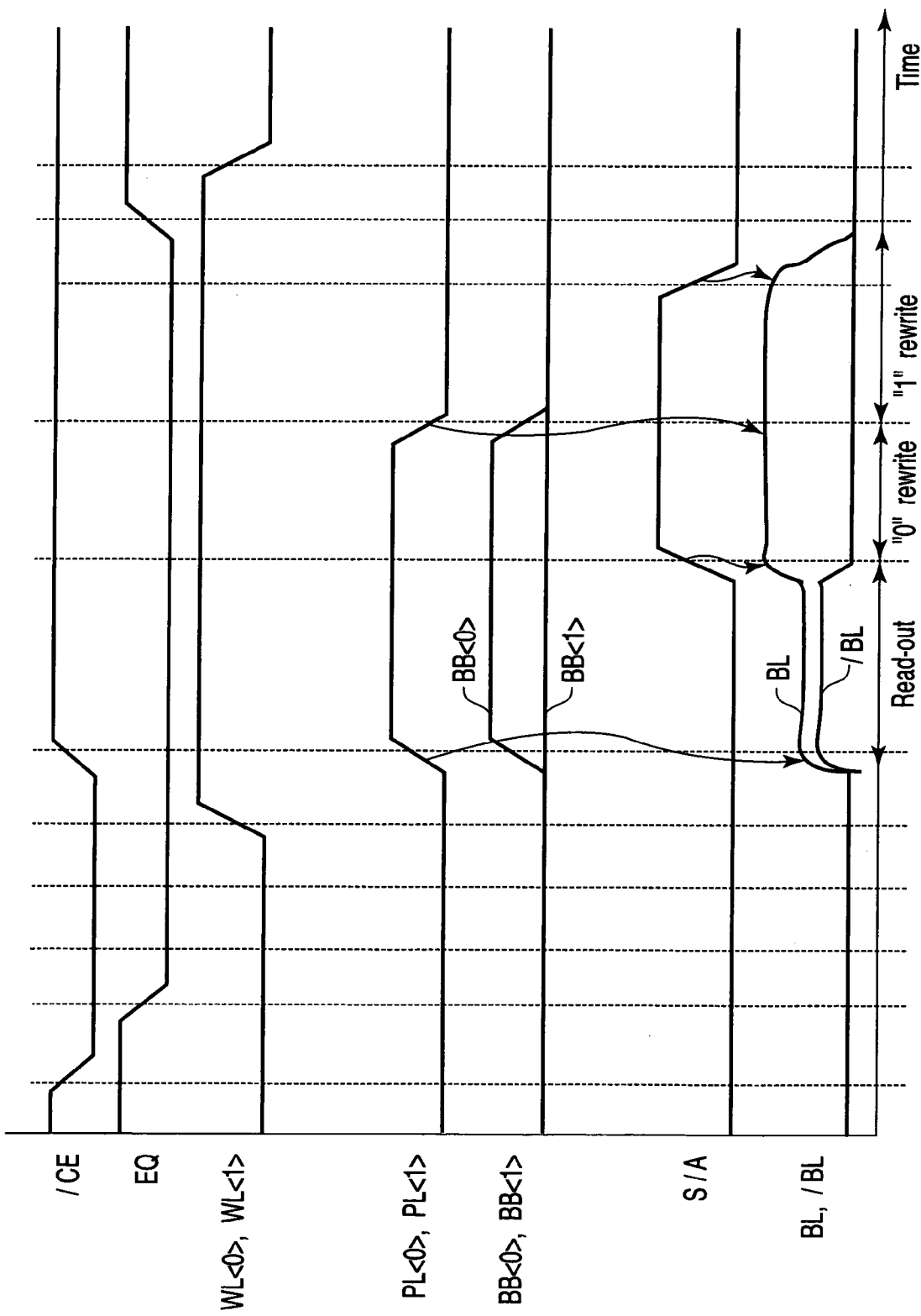
FIG. 14 is an operation timing chart of the semiconductor storage device according to the fifth embodiment.

FIG. 13 is a circuit diagram of the semiconductor storage device according to a fifth embodiment of the present invention, and FIG. 14 is a timing chart of its operation. The first to fourth embodiments have considered the form of applying, to the 2T2C mode, the dummy capacitors which generate the reference potential in the 1T1C mode, but in the fifth embodiment, the potentials of the bit lines BL, /BL are increased by coupling through supplementary capacitances C15, C16 of the bit lines BL, /BL, without involving a switch such as the NMOS transistor.

As shown in FIG. 14, a boost potential (high) is supplied only to a bit line potential boost line BB<0> connected to the capacitor C16 added to the bit line /BL where the "0" signal is read. In this way, the "0" signal voltage distribution is shifted toward the "1" signal voltage distribution, and those with a small signal voltage located at the bottom in the "1" signal voltage distribution can be screened. It is to be noted that stabilizing capacitance to the bit lines may be diverted to the above-described supplementary capacitors C15, C16.

Sixth Embodiment

Figure 15:
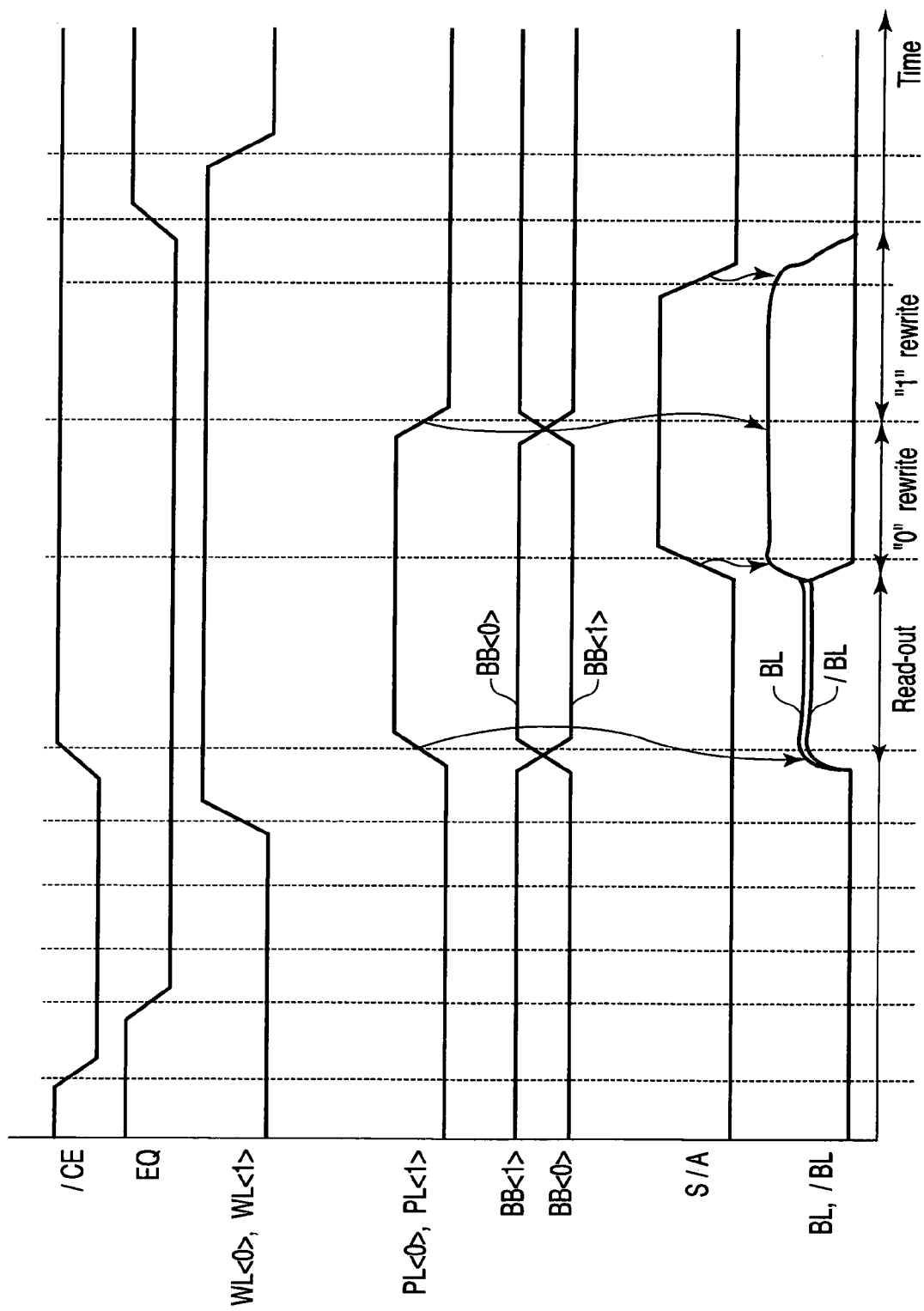
FIG. 15 is an operation timing chart of the semiconductor storage device according to a sixth embodiment.

A sixth embodiment enables another operation mode by use of the circuit configuration in FIG. 13, and FIG. 15 shows a timing chart of its operation. The sixth embodiment is similar to the fifth embodiment in that the capacitances directly added to the bit lines are used to increase the bit line potential without involving the switch such as the NMOS transistor. The difference is that the potential of the bit line /BL where the "0" signal is read is increased by coupling, but the potential of the bit line BL where the "1" signal is read is decreased by coupling.

That is, in FIG. 15, after the word lines WL<0>, WL<1> are activated, the plate lines PL<0>, PL<1> are brought high, and the potential of a bit line potential boost line BB<1> changes from high to low, while the potential of the BB<0> changes from low to high. Consequently, the "0" signal voltage distribution read to the bit line /BL and the "1" signal voltage distribution read to the bit line BL can be closer to each other, and the cell pairs with a narrow operation margin located at the bottom of the distribution can be effectively screened. It is to be noted that the stabilizing capacitance to the bit lines may be diverted to the above-described supplementary capacitors.

Seventh Embodiment

Figure 16:
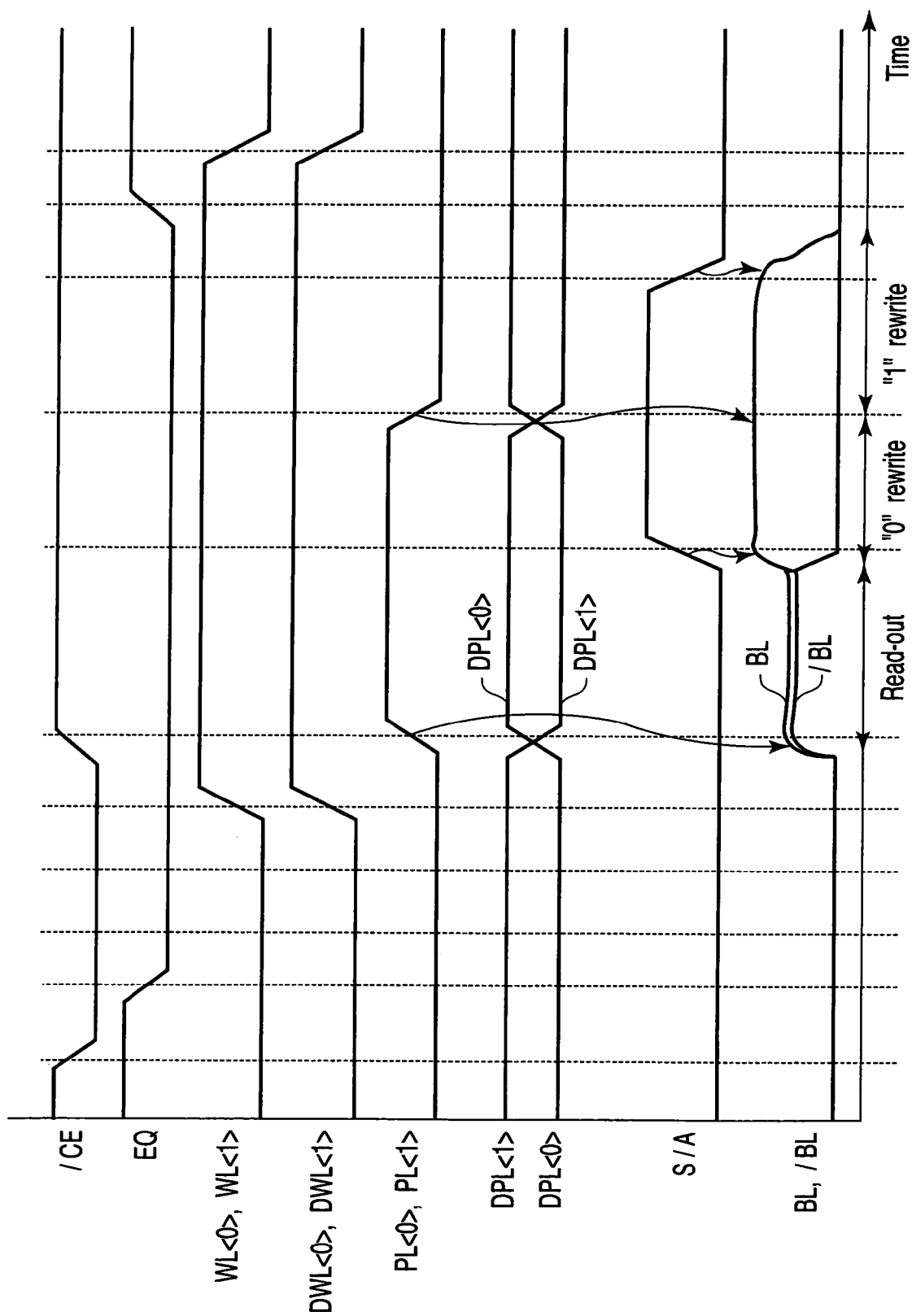
FIG. 16 is an operation timing chart of the semiconductor storage device according to a seventh embodiment.

A seventh embodiment shows a method of realizing a test mode different from those in the first to third embodiments by use of the circuit configuration in FIG. 5, 7 or 10. The sixth embodiment has shown the configuration in which the supplementary capacitances of the bit lines are directly used to increased or decreased the bit line potential by coupling without involving the switch such as the NMOS transistor, but the dummy capacitors C11, C12 can be connected to the bit lines BL, /BL via the NMOS transistors Q11, Q12 in the circuit configuration of FIG. 5, 7 or 10. FIG. 16 shows its operation timing.

That is, the potential of the plate electrode of the capacitor C12 connected to the bit line /BL where the "0" signal is read is increased through the DPL<0> to increase the potential of the bit line /BL. Further, the potential of the plate electrode of the capacitance C11 connected to the bit line BL where the "1" signal is read is decreased through the DPL<1> to decrease the potential of the bit line BL.

More specifically, as in FIG. 16, after the word lines WL<0>, WL<1> and the dummy word lines DWL<0>, DWL<1> are activated, the plate lines PL<0>, PL<1> are brought high, and the potential of the dummy plate line DPL<1> changes from high to low, while the potential of the DPL<0> changes from low to high. Consequently, the "0" signal voltage distribution read to the bit line /BL and the "1" signal voltage distribution read to the bit line BL can be closer to each other, and the cell pairs with a narrow operation margin located at the bottom of the distribution can be effectively screened.

Figure 17:
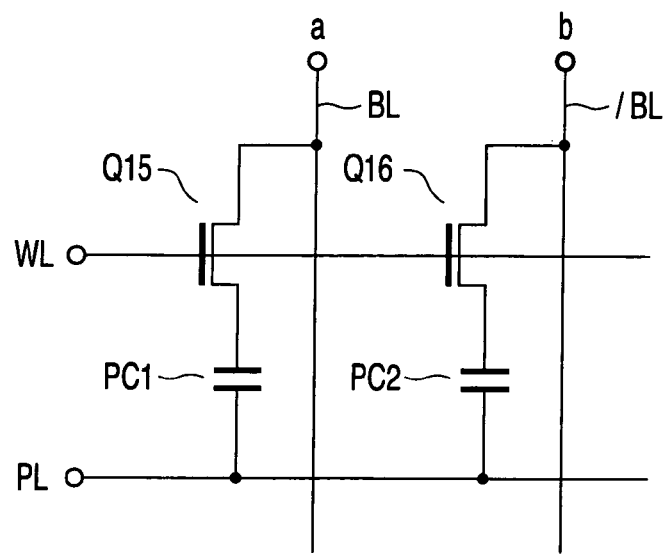
FIG. 17 shows a circuit configuration example of a memory cell using paraelectric capacitors.
Figure 18:
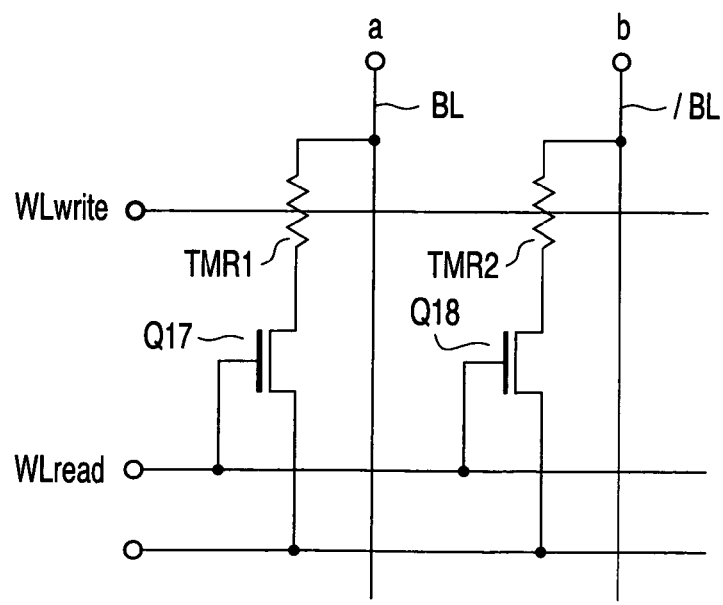
FIG. 18 shows a circuit configuration example of a memory cell using magnetoresistive elements.

While the memory cell using the ferroelectric capacitor has been used to describe the first to seventh embodiments above, the present invention is not limited thereto, and it is possible to use, as the memory cell, not only a memory cell with a folded bit line scheme using paraelectric capacitors PC1, PC2 and MOS transistors Q15, Q16 as shown in FIG. 17, but also a magnetic memory (MRAM) with a folded bit line scheme using magnetoresistive elements TMR1, TMR2 and MOS transistors Q17, Q18 as shown in FIG. 18, if some adaptation circuits are added.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
   a first word line and a second word line extending in a first direction;
   a first bit line and a second bit line extending in a second direction intersecting with the first direction;
   a first memory cell connected to the first word line and the first bit line;
   a second memory cell connected to the second word line and the second bit line;
   a sense amplifier connected between the first bit line and the second bit line;
   a first capacitor having a first storage electrode and a first plate electrode, the first storage electrode being connected to the first bit line;
   a second capacitor having a second storage electrode and a second plate electrode, the second storage electrode being connected to the second bit line;
   a first wire connected to the first plate electrode of the first capacitor; and a second wire connected to the second plate electrode of the second capacitor, wherein the first bit line and the second bit line are in a complementary relation, and when "0" is read to the first bit line, the first capacitor has an operation to increase a potential of the first plate electrode through the first wire before the sense amplifier operates.

2. The semiconductor storage device according to claim 1, further comprising an operation to decrease a potential of the second plate electrode through the second wire at the same time with the operation to increase the potential of the first plate electrode through the first wire.

3. The semiconductor storage device according to claim 1, wherein the first capacitor and the second capacitor are capacitors to stabilize the first bit line and the second bit line.

4. The semiconductor storage device according to claim 1, further comprising:
a first MOS transistor connected between the first bit line and the first storage electrode of the first capacitor, and having a first conductive path and a first gate electrode;
a second MOS transistor connected between the second bit line and the second storage electrode of the second capacitor, and having a second conductive path and a second gate electrode;
a first dummy word line connected to the first gate electrode; and
a second dummy word line connected to the second gate electrode.

5. The semiconductor storage device according to claim 4, further comprising:
a first pre-charger connected to the first storage electrode of the first capacitor; and
a second pre-charger connected to the second storage electrode of the second capacitor,
wherein a charge previously given to the first pre-charger is injected to the first bit line where the "0" is read.

6. The semiconductor storage device according to claim 1, wherein each of the first memory cell and the second memory cell comprises a third MOS transistor and a third capacitor that are connected in series.

7. The semiconductor storage device according to claim 6, wherein the third capacitor is a ferroelectric capacitor.

8. The semiconductor storage device according to claim 1, wherein the first memory cell and the second memory cell are ferroelectric memories having a series connection of transistor/capacitor parallel-connection units.

9. The semiconductor storage device according to claim 8, further comprising: a plate connected to the ferroelectric memory having the series connection of the transistor/capacitor parallel-connection units; and a block selection gate to select the ferroelectric memory having the series connection of the TC parallel-connection units.

10. A semiconductor storage device comprising:
a first word line and a second word line extending in a first direction;
a first bit line and a second bit line extending in a second direction intersecting with the first direction;
a first memory cell connected to the first word line and the first bit line;
a second memory cell connected to the second word line and the second bit line;
a sense amplifier connected between the first bit line and the second bit line;
a first MOS transistor having a first conductive path and a first gate electrode, one end of the first conductive path being connected to the first bit line;
a second MOS transistor having a second conductive path and a second gate electrode, one end of the second conductive path being connected to the second bit line;
a first dummy word line connected to the first gate electrode;
a second dummy word line connected to the second gate electrode;
a first capacitor having a first storage electrode and a first plate electrode, the first storage electrode being connected to the other end of the first conductive path;
a second capacitor having a second storage electrode and a second plate electrode, the second storage electrode being connected to the other end of the second conductive path;
a first pre-charger connected to the first storage electrode of the first capacitor;
a second pre-charger connected to the second storage electrode of the second capacitor;
a first dummy plate line connected to the first plate electrode of the first capacitor; and
a second dummy plate line connected to the second plate electrode of the second capacitor,
wherein the first bit line and the second bit line are in a complementary relationship, and when "0" is read to the first bit line, a charge previously given to the first pre-charger is injected to the first bit line before the sense amplifier operates.

11. The semiconductor storage device according to claim 9, wherein when the charge previously given to the first pre-charger is injected to the first bit line, a potential of the first plate electrode of the first capacitor maintains an immediately preceding potential.

12. The semiconductor storage device according to claim 10, further comprising an operation to decrease a potential of the second plate electrode through the second dummy plate line at the same time with an operation to increase the potential of the first plate electrode through the first dummy plate line.

13. The semiconductor storage device according to claim 10, wherein the first pre-charger and the second pre-charger are supplied with power by one feeder line.

14. The semiconductor storage device according to claim 13, wherein the second pre-charger is inactivated.

15. The semiconductor storage device according to claim 10, further comprising an operation to decrease the potential of the second plate electrode through the second dummy plate line at the same time with an operation to increase the potential of the first plate electrode through the first dummy plate line.

16. The semiconductor storage device according to claim 10, wherein each of the first memory cell and the second memory cell comprises a third MOS transistor and a third capacitor that are connected in series.

17. The semiconductor storage device according to claim 16, wherein the third capacitor is a ferroelectric capacitor.

18. The semiconductor storage device according to claim 10, wherein the first memory cell and the second memory cell are ferroelectric memories having a series connection of transistor/capacitor parallel-connection units.

19. The semiconductor storage device according to claim 18, further comprising:
a plate line connected to the ferroelectric memory having the series connection of the transistor/ capacitor parallel-connection units; and a block selection gate to select the ferroelectric memory having the series connection of the transistor/ capacitor parallel-connection units.

* * * * *